United States Patent [19]

Fritzemeier et al.

[11] Patent Number: 4,981,528

[45] Date of Patent: Jan. 1, 1991

[54] HOT ISOSTATIC PRESSING OF SINGLE CRYSTAL SUPERALLOY ARTICLES

[75] Inventors: Leslie G. Fritzemeier, Reseda; Jon D. Frandsen, Canoga Park, both of Calif.

[73] Assignee: Rockwell International Corporation, El Segundo, Calif.

[21] Appl. No.: 97,232

[22] Filed: Sep. 16, 1987

[51] Int. Cl.$^5$ .............................................. C21D 1/00
[52] U.S. Cl. .................................. 148/11.5 N; 148/3; 148/410; 148/428; 419/42; 419/49; 419/68; 420/447; 420/590
[58] Field of Search ................. 419/42, 49, 68; 148/3, 148/11.5 N, 410, 428; 420/447, 590

[56] References Cited

U.S. PATENT DOCUMENTS

| | | | |
|---|---|---|---|
| 3,567,526 | 3/1971 | Gell et al. | 148/32.5 |
| 4,222,794 | 9/1980 | Schweizer et al. | 420/448 |
| 4,371,404 | 2/1983 | Duhl et al. | 148/162 |
| 4,677,035 | 6/1987 | Fiedler et al. | 420/448 |
| 4,719,080 | 1/1988 | Duhl et al. | 420/448 |

OTHER PUBLICATIONS

Evans, D. J., "Powder Metallurgy Processing of High Strength Turbine Disk Alloys", *American Society of Mechanical Engineers*, Mar. 1976, Pub. 76–GT–96.

Van Drunen, G. et al., "Hot Isostatic Processing of IN-738 Turbine Blades", Westinghouse Canada Limited 13–1/11.

*Primary Examiner*—Stephen J. Lechert, Jr.
*Attorney, Agent, or Firm*—H. Fredrick Hamann; Harry B. Field; David C. Faulkner

[57] ABSTRACT

A method for the densification of a shaped nickel base single crystal alloy article utilizing a pre-HIP, an improved hot isostatic pressing (HIP) step, and post-HIP solution heat treatment to enhance removal of casting porosity in a finished article.

3 Claims, No Drawings

HOT ISOSTATIC PRESSING OF SINGLE CRYSTAL SUPERALLOY ARTICLES

STATEMENT OF GOVERNMENT INTEREST

The invention described herein was made in the performance of work under Contract No. NAS8-27980 and is subject to the provisions of Section 305 of the National Aeronautics and Space Act of 1958(72 Stat. 435; 42 USC 2457).

BACKGROUND OF THE INVENTION

1. Technical Field

This invention relates to nickel base superalloy single crystal castings or articles such as turbine engine blades and vanes and a method for densification of such castings.

2. Background Art

Single crystal nickel base superalloys are cast to produce articles having superior strength characteristics at elevated operating temperature. Due to the nature of the alloy and method of casting, these castings contain porosity on the order of 0.2 to 0.5% by volume. These pores have been found to be the primary initiation site for cracks which lead to fatigue failure. Removal of these pores lends a significant improvement to the component's life cycle. Conventional hot isostatic pressing (HIP) techniques have been applied to single crystal components without success.

Standard HIP pressures of about 15,000 psi are adequate to eliminate porosity but result in internal recrystallization which negates much of the benefits. HIP temperature control has been found to be critical. At temperatures below the accepted solution heat treatment range, the strength of the material resists the deformation necessary for closure of pores and the thermal energy is insufficient to bond the closed pores.

Single crystal superalloys are also prone to incipient melting, the localized melting of second phases in the microstructure, at temperatures above the accepted solution heat treatment range. The acceptable solution heat treatment range of cast superalloy single crystals can be as narrow as approximately 5° F. while a typical HIP vessel temperature range may vary up to about 20° F.

For optimum properties, single crystal superalloys must be cooled from the solution heat treatment temperature at rates greater than those achievable in production HIP vessels. This requires a post-HIP solution heat treatment to achieve the desired cooling rate. Pores closed by HIP have been found to reopen during standard solution heat treatment due to the diffusion of alloying elements.

DISCLOSURE OF INVENTION

A hot isostatic pressing schedule or method for the densification of a shaped nickel based single crystal alloy article comprises the sequential steps of:

(a) solution heat treatment of the article to homogenize the alloy microstructure of the article;

(b) transferring the solution heat treated article to a hot isostatic pressing vessel;

(c) heating the vessel and article contained therein to about the center of the solution heat treatment range at about 5,000 psi until article casting pores are removed and internal recrystallization is avoided;

(d) homogenizing and cooling the article while avoiding reopening pores; and (e) recovering the article so formed.

An improved hot isostatic pressing (HIP) cycle or schedule is provided to insure closure of internal casting porosity while still avoiding internal recrystallization.

The improved HIP process is achieved by modifying the HIP schedule (step "c" above) to slowly increase pressure within the HIP vessel while controlling temperature and time parameters during the treatment of a shaped nickel base single crystal alloy article.

Accordingly, it is an object of the present invention to provide an improved method of hot isostatic pressing for the removal of casting porosity from single crystal superalloy castings or articles.

Yet another object of the present invention is the formation of shaped nickel base single crystal alloy articles such as turbine engine turbine blades and vanes processed according to the method of the present invention.

These and other objects and features of the present invention will be apparent from the following detailed description.

DETAILED DESCRIPTION

Nickel base superalloy single crystal cast articles normally containing less than about 0.5% porosity by volume are solution treated according to standard practice for the subject alloy.

A homogenized structure with acceptable microstructure is thus produced. This pre-HIP homogenization widens the allowable temperature range for HIP by increasing the incipient melting temperature and reduces the time required during the post-HIP solution heat treatment cycle.

The improved HIP cycle is as follows:

(a) heat to the solution heat treatment temperature of the article(s) under inert gas (e.g. argon) at a pressure not to exceed 5000 psi.

(b) stabilize at this temperature and pressure for one (1) hour.

(c) increase pressure at a constant rate, in no less than two (2) hours to 15,000 psi, while maintaining temperature.

(d) hold temperature and pressure for four (4) hours.

The article(s) is then homogenized at the article solution heat treatment temperature in a conventional heat treatment furnace for approximately 60 minutes and cooled at the prescribed optimum rate for the alloy article. The final product approaches 100% of theoretical density and avoids the occurrence of internal recrystallization. This in turn provides the article thus produced and recovered with optimized mechanical properties.

The following nonlimiting example is illustrative of the improved HIP densification method for nickel base single crystal alloy articles.

EXAMPLE

One alloy suitable for treatment according to the present invention is PWA 1480(Trademark of Pratt & Whitney Aircraft Group) having the following composition by weight:

| Element | Minimum | Maximum |
| --- | --- | --- |
| Chromium | 9.50 | 10.50 |
| Cobalt | 4.50 | 5.50 |

-continued

| Element | Minimum | Maximum |
| --- | --- | --- |
| Tungsten | 3.75 | 4.25 |
| Titanium | 1.25 | 1.75 |
| Tantalum | 11.75 | 12.25 |
| Aluminum | 4.75 | 5.25 |
| Carbon | — | 200 ppm |
| Manganese | — | 0.012 |
| Silicon | — | 0.12 |
| Phosphorus | — | 0.015 |
| Sulfur | — | 0.015 |
| Boron | — | 30 ppm |
| Zirconium | — | 75 ppm |
| Iron | — | 0.20 |
| Copper | — | 0.10 |
| Hafnium | — | 75 ppm |
| Nickel | Remainder | |

First, the article to be HIP treated is solution heat treated to homogenize the microstructure and thereby provide a wider temperature range allowance for the HIP process and reduce the post-HIP homogenization time. In this step, the article is heated to about 2350° F. plus or minus 5° F. at which temperature the article will be held for about 4 hours. Following this heat treatment, the article is then cooled at greater than 115° F. per minute to below 1800° F. The second step involves transferring the pre-HIP processed nickel-based alloy article to a HIP vessel. This vessel and article contained therein is heated to a temperature of about 2350° F. plus or minus 20° F. under isostatic pressure of about 5,000psi. Temperature and pressure are held at 2350° F. and 5,000 plus or minus 500 psi for about one (1) hour, plus or minus 15 minutes.

The pressure within the HIP vessel is then increased at a constant rate in no less than two (2) hours to 15,000 psi while maintaining the solution heat treatment temperature which is 2350° F. plus or minus 20° F. These temperature and pressure levels are maintained for four (4) hours followed by cooling of the HIP treated article.

These parameters have been found to improve the removal of casting pores while avoiding internal recrystallization.

Following the hot isostatic pressing step, the articles are then homogenized for about 60 minutes at 2360° F. plus or minus 20° F. and cooled at a rate greater than 115° F. per minute to below at least 1800° F. This step re-solutions the precipitate formed during cooling in the HIP vessel and is short enough to avoid pore resurgence.

This produces a final article having enhanced mechanical properties capable of sustained performance in a high temperature environment.

Obviously, many modifications and variations of the present invention are possible in light of the above teachings. It is therefore to be understood that, within the scope of the appended claims the invention may be practiced otherwise than as specifically described.

What is claimed and desired to be secured by Letters Patent of the United States is:

1. In the densification of a shaped nickel base single crystal alloy article, wherein the solution heat treated article is transferred to an isostatic pressing vessel, heating the vessel and the article contained therein under inert gas at stabilized pressure of about 5,000 psi and at a solution heat treatment temperature for one hour, increasing pressure at a constant rate in no less than two hours to 15,000 psi while maintaining the solution heat treatment temperature; holding the temperature and pressure levels for four hours, then cooling as rapidly as possible to minimize gamma prime precipitation and coarsening.

2. In the densification of a shaped nickel base single crystal alloy article according to claim 1, wherein the solution heat treatment temperature is about 2350° F.

3. An article of manufacture produced according to claim 1.

* * * * *